(12) United States Patent
Hellums et al.

(10) Patent No.: US 6,671,663 B1
(45) Date of Patent: Dec. 30, 2003

(54) TIME DOMAIN NOISE ANALYSIS

(75) Inventors: James R. Hellums, Plano, TX (US); James R. Hochschild, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 752 days.

(21) Appl. No.: 09/103,704

(22) Filed: Jun. 24, 1998

Related U.S. Application Data

(60) Provisional application No. 60/051,196, filed on Jun. 30, 1997.

(51) Int. Cl.[7] .............................................. G06F 17/50
(52) U.S. Cl. .............................. 703/14; 703/2; 702/57; 702/117; 702/190; 716/4
(58) Field of Search .................... 395/500; 364/578; 703/1–2, 14–22; 702/57, 117, 190; 716/4

(56) References Cited

U.S. PATENT DOCUMENTS 5,663,890 A * 9/1997 Saleh et al. ............ 395/500.25
5,682,336 A * 10/1997 Chian et al. ........... 395/500.24

OTHER PUBLICATIONS

Popescu et al, "A Noise Modelling Approach for Accurate Time Domain Analysis", IEEE 1996 International Semiconductor Conference, pp. 553–556. Oct. 1996.*

Kasdin, "Discrete Simulation of Colored Noise and Stochastic Processes and 1/($f_\Lambda$ alpha) Power Law Noise Generation", Proceedings of the IEEE, pp. 802–827. May 1995.*

Dong et al, "Efficient Monte–Carlo Thermal Noise Simulation for Sigma–Delta Modulators", IEEE Proceedings of the 1997 Custom Integrated Circuits Conference, pp. 499–502. May 1997.*

P. Bolcato et al., "A new approach for Noise simulation in transient analysis," 1992 IEEE, pp. 887–890.

Demir et al., "Time–Domain Non–Monte Carlo Noise Simulation for Nonlinear Dynamic Circuits With Arbitrary Excitations," *IEEE Transactions an Computer Aided Design of Integrated Circuits and Systems*, vol. 15, No. 5, May 1996, pp. 493–505.

* cited by examiner

*Primary Examiner*—Samuel Broda
(74) *Attorney, Agent, or Firm*—Carlton H. Hoel; W. James Brady; Frederick J. Telecky, Jr.

(57) ABSTRACT

A circuit simulator is provided for simulating the operation of a circuit in the time domain by accounting for the physical fluctuation (noise) in the time domain. Each of the components (14) in the matrix (10) has associated therewith an active current generator which can be simulated by the simulator in the time domain. In parallel with this active current generator, a stochastic (random) process current generator is provided. This stochastic current generator for each element will utilize a Gaussian random number generator (with 0 mean and a variance equal to 1) that is scaled by the standard deviation (square root of the variance) of the physical noise process that exists within the device. Additionally, this Gaussian random number generator is scaled by a factor that accounts for the time step or discrete operation of the noise simulator.

13 Claims, 5 Drawing Sheets

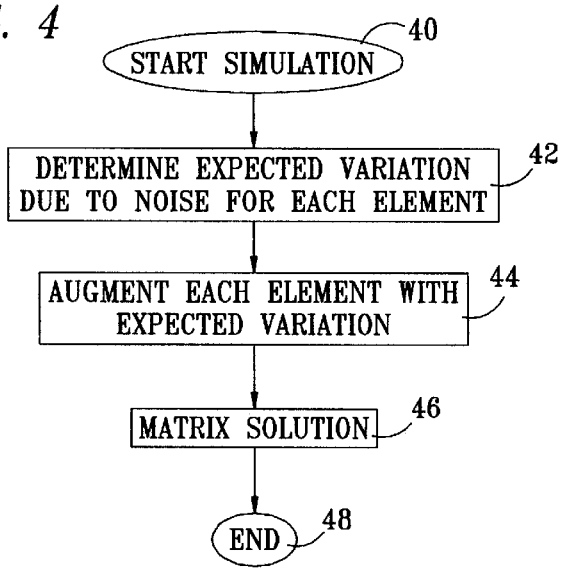
FIG. 4
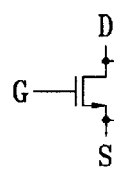 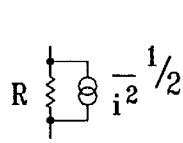 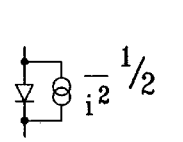 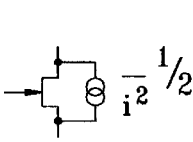 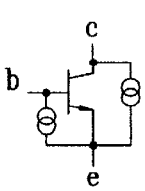
FIG. 5a   FIG. 5b   FIG. 5c   FIG. 5d   FIG. 5e
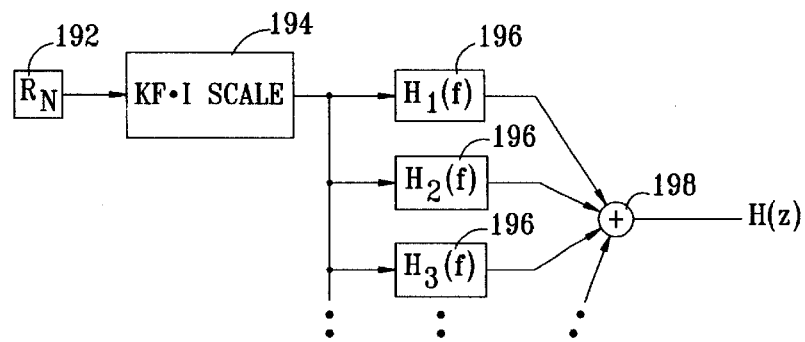
FIG. 12

TIME DOMAIN NOISE ANALYSIS

This application claims priority under 35 USC §119(e)(1) of provisional application No. 60/051,196 filed Jun. 30, 1997.

TECHNICAL FIELD OF THE INVENTION

The present invention pertains in general to electrical circuit simulators and, more particularly, to an electrical circuit simulator for performing noise analysis in the time domain.

BACKGROUND OF THE INVENTION

During the design of a product, the design engineer takes advantage of all of the design tools available to him in order to evaluate the design prior to actually releasing the design to manufacturing in order to have a prototype manufactured. Prior to the emergence of current electrical simulators, it was necessary to first design an integrated circuit and then evaluate it with the available analysis tools and then release it to manufacturing in order to have the circuit manufactured in the form of a wafer. Typically, this could take two or more iterations, each iteration being a very time consuming process. It was not unexpected in the early days of integrated circuits to take upwards of six months to complete and evaluate a single iteration of a design.

With current day design techniques, the design engineer relies upon simulators to evaluate their circuit design. These simulators have become very sophisticated, such that the design time for a product is significantly decreased and the confidence level in the performance of the circuit is very high after evaluation by the simulator program. It is not uncommon for the "first silicon" to work substantially as designed. One type of simulator program currently utilized is the SPICE program or a facsimile thereof.

One limitation of current simulators is their ability to evaluate the noise performance of a circuit. For small signal circuits such as amplifiers, the small signal noise analysis can be performed with the simulators. The reason for this is that the simulators perform an AC analysis of the circuit, this analysis always being performed in the frequency domain with the simulated circuit set to fixed bias points on all the components in the circuit, this being the DC operating point of each of the circuits.

The usefulness of the simulation with respect to noise is often limited due to the inaccuracy of the noise model that is utilized. For instance, it is well known that noise models for MOS transistors (thermal and flicker noise) are incomplete and cannot be utilized in some bias regions. For example, if a comparator were being evaluated, it is possible for the DC bias point to vary considerably due to noise considerations. Therefore, traditional noise simulations can only be applied to circuits which operate in small signal conditions and it is therefore not possible to analyze circuits that cannot be simulated in the AC analysis mode for these simulators.

In order to accommodate noise considerations with varying DC operating points, circuits have been analyzed in the time domain utilizing a transient noise analysis. One such approach is disclosed in P. Bolcato and R. Poujois, "A New Approach for Noise Simulation and Transient Analysis," IEEE, 1992, Page 887–890. In the transient analysis disclosed in Bolcato, the noise simulation is performed in time domain of the circuit. In their approach, current sources are introduced into each noisy component, resistors, diodes, MOSFETs, JFETs and BJTs. The sources are designed to represent the noise equivalent current sources of the devices. In simulating the noise sources, an attempt is made to represent the physical noise source of each of the devices with the added noise source. Although it is noted that noise signals could have been generated by sets of random values with controlled variance or amplitude distribution or as continuous signals between two discrete values, Bolcato clearly states that these kinds of signals are known to disturb the normal functioning of the simulator. The approach is to generate a sum of a fixed number of sinusoids by the following equation:

$$n(t) = \sum_{i=1}^{N_f} a_i(t)\_\sin(\omega_{it} + \varphi_i)$$

The reason for utilizing this approach is that it is believed by the author that this will not disrupt the simulator behavior due to the fact that the signals are continuous and fully deterministic. The reason for this is that the simulator operates on discrete samples and is therefore not a continuous simulation. Therefore, the author has opted not to utilize the technique of either generating signals with sets of random values with controlled variance or amplitude distribution or by generating signals that are continuous between two discrete values. By utilizing a fixed number of sinusoids and summing them, there must be some type of iterative technique utilized to generate the sinusoids to result in a theoretical noise spectrum, i.e., this is a deterministic approach. The disadvantage to this type of system is that it does not fully represent the stochastic noise process that exists in a device.

SUMMARY OF THE INVENTION

The present invention disclosed and claimed herein comprises a simulator for simulating the noise response of an electrical circuit in the time domain. The simulator operates in discrete time steps $T_S$ and includes a matrix of electrical circuit components which make up the electrical circuit. An analyzer is provided for analyzing the transient response of the circuit elements in the time domain with a known input signal to provide a current value for each of the elements. A stochastic noise source is associated with each of the elements, each for generating a stochastic noise current for the associated element. This stochastic noise current represents a stochastic random process comprised of a white noise source scaled by the standard deviation of the physical noise process that exists within the associated element. A summing device is associated with each of the elements for summing the generated noise current for the associated one of the stochastic noise sources with the current values for each of the elements. A matrix solver then solves the matrix after the summing device has performed the associated summing operation.

BRIEF DESCRIPTION OF THE DRAWINGS

For a more complete understanding of the present invention and the advantages thereof, reference is now made to the following description taken in conjunction with the accompanying Drawings in which:

FIG. 4 illustrates a flowchart for the overall simulation operation;

FIGS. 5a–5e illustrate five devices with added current sources;

FIG. 12 illustrates a block diagram of the FIR filter for determining the colored or 1/f noise component of the noise.

DETAILED DESCRIPTION OF THE INVENTION

Figure 1:
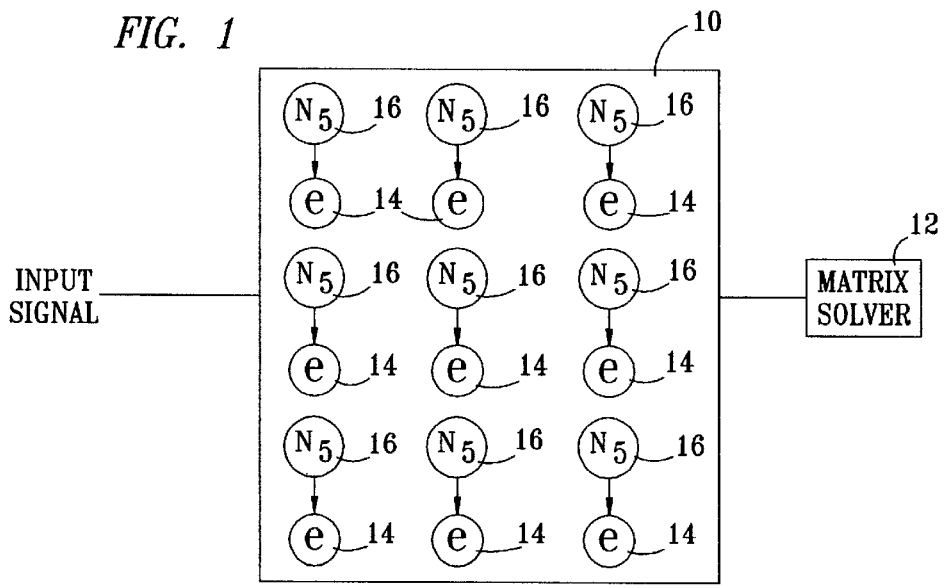
FIG. 1 illustrates a matrix of elements each having associated therewith their own noise source.

Referring now to FIG. 1, there is illustrated a block diagram of a matrix 10 utilized in an electrical simulator. The electrical simulator typically generates an input signal for input to the matrix 10. The matrix 10, once defined, is then processed through a matrix solver 12, which matrix solver is operable to perform the simulation operation. However, prior to performing the simulation operation, the circuit must be defined and the circuit is defined as the matrix 10.

The matrix 10 is comprised of a plurality of circuit elements 14, each of which elements can either be MOSFETs, resistors, JFETs, etc. The generation of the matrix 10 of the elements 14 is conventional. In addition to the elements, there are a plurality of noise sources 16 that are independently generated for each element 14 to generate a noise current, which noise current is summed with the current in the associated element 14. It should be noted that this noise is generated in the time domain and summed with the time domain current of the associated elements 14. By comparison, a typical AC analysis will generate a white noise component and a colored noise component associated with a 1/f noise for each element according to a pre-defined model for that noise. However, it is also noted that this AC noise is only valid for a given DC operating point. As will be described hereinbelow, the physics of each of the devices is accounted for in generating the time domain noise component which is utilized to scale a random number generated to provide an overall stochastic (random) process current generator. The general simulator operation was first introduced by L. Nagel, Ph.D. dissertation, University of California at Berkley, 1975, which is incorporated herein by reference. Additionally, the general operation of the SPICE simulator is described in K. S. Kundert, The Designer's Guide to SPICE & SPECTRE®, Kluwer Academic Publishers, 1995, which is incorporated herein by reference.

Figure 2:
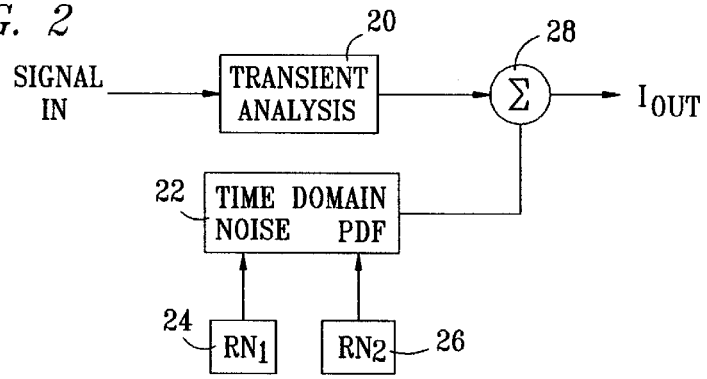
FIG. 2 illustrates a block diagram of the process for determining noise at each element and summing that noise with the operation of the device in the time domain.

Referring now to FIG. 2, there is illustrated a block diagram of the process associated with a single one of the elements 14. The illustrated element 14 is processed in the time domain with a general transient analysis, as represented by a block 20. This generally will provide the current in the time domain for the DC operating points and the signal input to the device. At the same time, a noise current generator is provided by a block 22 which basically calculates the time domain noise probability density function (PDF). This block 22 represents an operation wherein a random number is received from one or more random number generators 24 or 26, there being certain devices that require more than one random number generator. As will be described hereinbelow, the use of a random number generator allows for the realization of a stochastic current generator. Each of the random number generators 24 and 26 utilizes a Gaussian random number generator with a zero mean and a variance equal to one. The time domain noise PDF block 22 is operable to scale the noise output by the random number generators 24 and 26 by the physical noise process that exists within the device. For example, in a MOSFET the physical noise sources are thermal noise, shot noise and 1/f noise. The thermal and shot noise, of course, are white noise sources whereas the 1/f noise is a colored noise source. The total added noise is then summed with the output of the transient analysis of the device in block 20 with a summing junction 28. When it is summed, the total added noise provides the stochastic current generator, $i^2$, and the square root of that added noise, $(i^2)^{1/2}$, will be summed with the current in the device.

Figure 3:
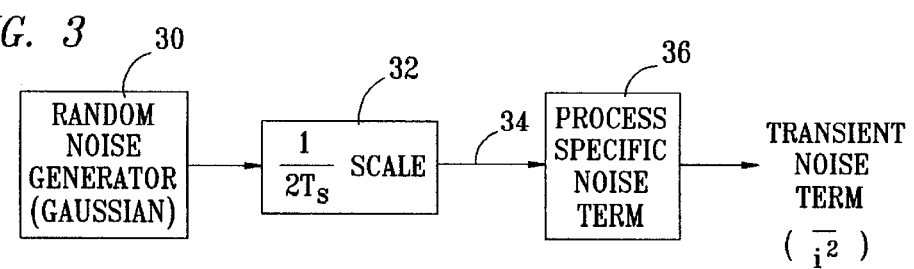
FIG. 3 illustrates the process flow for generating a random noise value and scaling that random noise value for each time step.

Referring now to FIG. 3, there is illustrated a block diagram of the process flow for a given element. As noted above, each element has a random noise generator associated therewith which generates a random noise value for a given step in the iterative process of the simulator. A noise generator is represented by a box 30, which random noise generator is essentially the same as the random noise generators 24 and 26 represented in FIG. 2. Again, the random noise generator 30 is a Gaussian random number generator with a 0 mean and a variance equal to 1. This random noise generator in general is considered to be a white noise source. However, this system operates in a sampled system environment which utilizes a stair-step signal, and this will result in a random value that is output by the generator that is held for the length of the step $T_S$, which is the time step period of the simulator. Under these conditions, the noise signal will have a spectral distribution $\sin(x)/x$ according to the following equation:

$$N(f) = A \frac{\sin(\pi T_s f)}{\pi T_s f}$$

The variance is set forth in the following equation:

$$\sigma_2 = \int_0^\infty N^2(f)\,df = 1$$

By substituting the value of $N^2(f)$ from Equation No. 2, the following relationship exists:

$$\frac{A^2}{\pi T_s} \int_0^\infty \left(\frac{\sin(x)}{x}\right)^2 dx = 1$$

where: $x = \pi T_s f$.

This will result in the scaling factor A, being equal to the following:

$$A = \sqrt{2T_S}$$

Therefore, if the noise source is correctly scaled according to the time step utilized and the noise spectral density of the element being simulated, and if the time step is made small enough such that band limiting effects in the circuit dominate bandwidth limitations of the noise source, the noise source will then be suitable for a time domain simulation of wide band noise. For example, consider the simulation of a resistor where the noise is set forth as follows:

$$\overline{i^2} = \frac{4kT}{R}\Delta f$$

where: k=Boltzmann's constant,
T=absolute temperature,
R=resistance.

This will require the random number generators to be scaled by the following $$\sqrt{\frac{\left(\frac{4kT}{R}\right)}{2T_s}}$$

relationship:

Therefore, the scaling factor required to ensure that the random number generator 30 is a white noise source in a stepped simulator that utilizes an iterative process will be $1/(2T_S)$. This is provided by a scaling block 32. The output of the scaling block 32 on a line 34 is the white random noise value scaled for the stepped process. It has been noted that it is necessary to ensure that the time step, $T_S$, is small enough to ensure that band limiting effects in the circuit will dominate bandwidth limitations of the noise source, and it is therefore necessary to experiment with the time step. This can easily be done by the designer. A filter could be utilized to filter the sampled noise source to flatten the spectrum to provide a decrease in sensitivity to the time step $T_S$ size, i.e., it may allow for the simulation to be run with a larger time step $T_S$.

Once a random noise source has been generated for a stepped simulator, then it is scaled by the physics of the device in a block 36 which represents a specific noise term associated with a particular element. This, again, is defined by the physics of the device and will therefore take into account the DC operating point for each step. This is to be compared with the AC analysis wherein the DC operating point is considered to be stable. As such, large single variations can be accounted for in this operation. Further, this is a distinct variation from the deterministic operation described in the prior art, i.e., this is basically a stochastic current generator that follows a stochastic process which more realistically represents the noise generated in a particular device. This, again, is due to the fact that the random noise generator is utilized with the scaling provided by the block 32 followed by the subsequent scaling by the specific physical parameters of a device. This results in the transient noise term, $i^2$.

Referring now to FIG. 4, there is illustrated a flowchart depicting the overall process flow for the simulator. In general, the simulator is initiated at a block 40. This is the general overall set up for the simulator which requires defining the various elements and the various values associated with the elements. For example, a transistor would have the parameters thereof defined in order to calculate the gain, the channel length and the channel width for a device such as a MOSFET. With this information, the physics of the device can be modeled. The models, of course, are built into the simulator. The program then flows to a function block 42 wherein the added noise value, $i^2$, is determined. In general, this step determines the expected variation due to noise for each element in the matrix. This, as described above, is a variation from the deterministic value approach, as this utilizes a stochastic process. The program will then flow to a function block 44 wherein each element will then be augmented with the expected variation, this being the value $(i^2)^{1/2}$. Once the stochastically determined noise current is determined and added with the predetermined current in the associated element, the device current determined with the simulator by conventional techniques, then the system proceeds to a function block 46 to perform a matrix solution for the given time step. This is the conventional operation of the simulator. The program will then flow to an End block 48, it being noted that this is iterated for each time step. By utilizing the Erodic theorem, the total noise can be calculated from a long time sequence simulation by taking the root mean square (RMS) of that simulation. Alternatively, the instantaneous noise for each step is determined and can be utilized for such applications as a comparator. For example, in a comparator with its inputs tied to a small reference voltage, the output without considering noise will be deterministic for each step $T_S$. With noise, this will be indeterminate and stochastic in nature. This is also the case with an analog-to-digital converter that may switch between two LSBs due to transient noise. With the present analysis technique, this can be simulated.

Referring now to FIGS. 5a–5e, there are illustrated electrical diagrams of five electrical components, FIG. 5a illustrating a MOSFET, FIG. 5b illustrating a resistor, FIG. 5c illustrating a diode, FIG. 5d illustrating a JFET and FIG. 5e illustrating a bi-polar junction transistor (BJT). Each of the devices in FIGS. 5a–5e have disposed in parallel therewith a noise source which is defined as $(i^2)^{1/2}$, with the BJT in FIG. 5e having multiple noise sources, which will be described in more detail hereinbelow.

Figure 6:
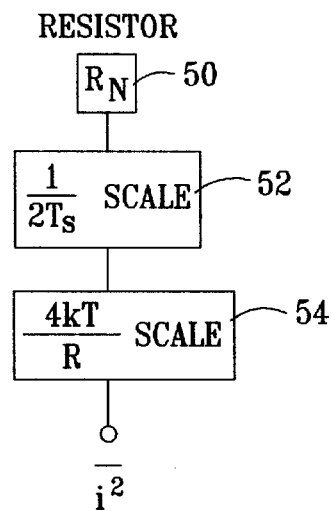
FIG. 6 illustrates a flowchart for determining the total noise in a resistor.

Referring now to FIG. 6, there is illustrated a general process flow for generating the stochastic noise current $(i^2)^{1/2}$. A separate random number generator is provided for the resistor, as represented by block 50. This is scaled by a block 52 for the $1/(2T_S)$ factor, such that for the simulator, white noise is provided. This is then scaled by the physics of the device, as defined in block 54 by the $$\frac{4kT}{R}$$

relationship:

For the resistor, this is white noise.

Figure 7:
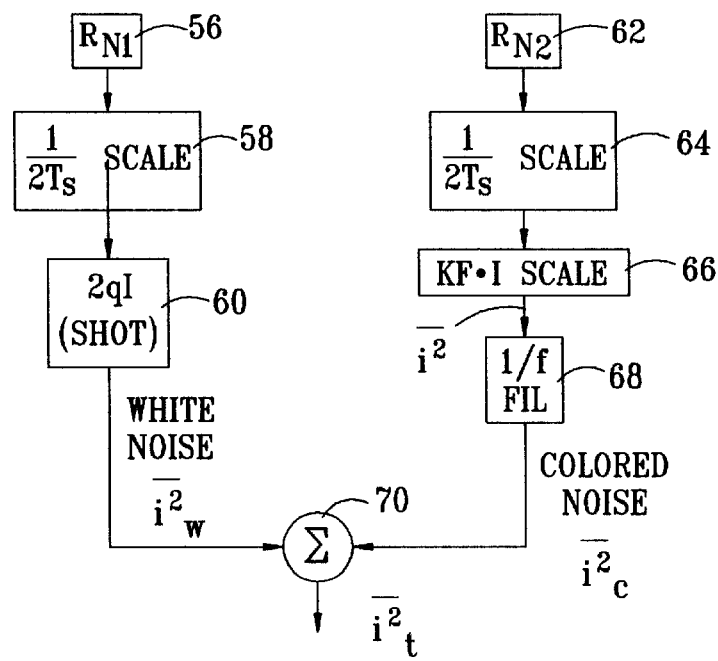
FIG. 7 illustrates a flowchart for determining the added noise in the time domain for a diode.

Referring now to FIG. 7, there is illustrated a process flow for determining the total variance of the current $i^2_T$ which is a combination of white noise and 1/f noise, this being referred to as colored variance of the noise $i^2_C$, hereinafter referred to as the "colored noise component" of the noise. The white noise is determined by utilizing a first random noise generator 56, which is scaled by $1/(2T)_S$ in a scaling block 58 for input to a scaling block 60. The scaling block 60 provides the shot noise relationship for the diode which is 2qI. This results in the white noise component $i^2_W$. The 1/f noise or the colored noise component $i^2_C$ requires a separate random noise generator 62, which is scaled by the $1(/2T_S)$ scaling factor in a block 64. This provides a white noise source for the simulator operation which is then scaled by the scaling factor KF·I, wherein the factors KF are user defined parameters and are heavily dependent on the technology used. All random noise sources described hereinbelow will be Gaussian noise source with a mean of zero and a variance of one. This provides the physical scaling for the 1/f noise. The 1/f component of this equation is provided by a 1/f filter as set forth in a block 68. This provides the colored noise component, $i^2{}_C$, which is summed with the white noise component in a summing block 70 to output the total stochastic noise component $i^2{}_T$. The colored noise basically comprises the 1/f component of the diode. As will be described hereinbelow, the 1/f filter is combined with the $1/(2T_S)$ scaling factor in block 64 through use of an Infinite Impulse Response (IIR) filter.

Figure 8:
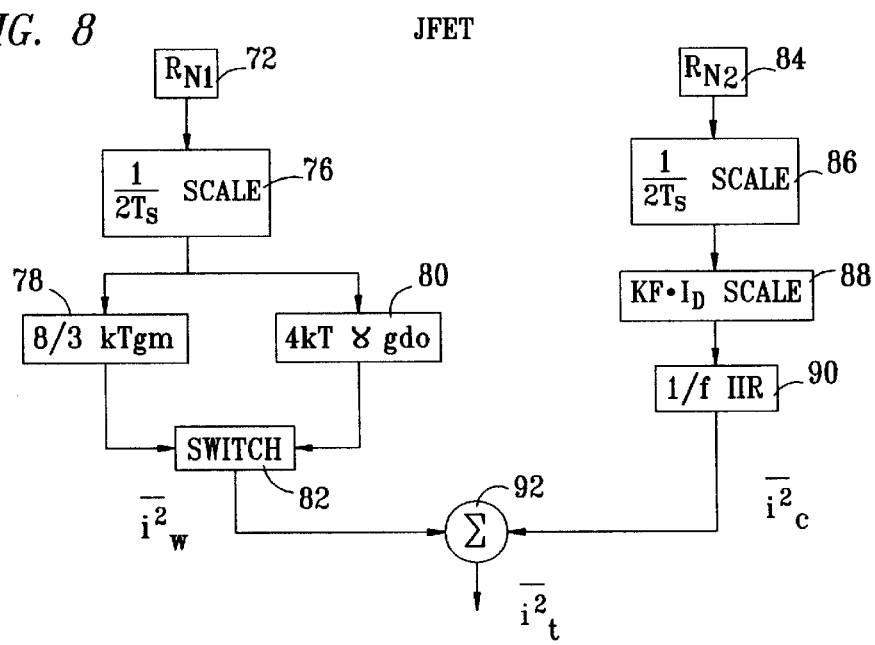
FIG. 8 illustrates a flowchart depicting the operation for determining the total added noise in the time domain for a JFET.

Referring now to FIG. 8, there is illustrated a flow diagram for the JFET. Essentially, there are two components for the JFET, the thermal noise and the 1/f noise. However, the thermal noise can be defined in terms of two models, what is referred to as an old model and a new model. The thermal noise is provided with a first random number generator 72 which is scaled by a $1/(2T_S)$ scaling block 76 to provide an output to one of two models. The first model is $$8/3\, kTg_m$$

defined by a block 78 which provides the following relationship:
 where: k is Boltzmann constant,
 T is the absolute temperature,
 $g_m$ is the JFET transconductance.
There is also a second model provided, as indicated by a block 80 which provides $$4\, kT\gamma g_{do}$$

the following model:
 where: k=Boltzmann constant,
 T=absolute temperature,
 $\gamma=(1-\eta+\_\eta^2)/(1-\tfrac{1}{2}\eta)$; $\eta=(V_{dS})/(V_{gs}-V_t)$
 $g_{do}$=channel conductance at zero drain-to-source voltage;

$$\partial I_D/\partial V_{ds}|_{Vds=0}$$

The two models represented in the block 80 are selected by the simulator with a switch block 82. The switch block can either select the model in block 78 or the model in block 80. However, it should be understood that each of these models is driven by a white noise source provided by the noise source in block 72 scaled for the simulator operation by the $1/(2T_S)$ scaling factor in block 76. This provides a white noise source at the output of block 76 for the step simulator operation, this not being a continuous operation. The white noise source is indicated as the component value $i^2{}_W$. The JFET also has the colored noise component or the 1/f noise. As was the case with the diode, this is provided for with a separate random noise source in a block 84 which is passed through a scaling block 86 to provide the $1/(2T_S)$ scaling factor to provide a white noise component for the simulator operation. This is then scaled by the physics of the device in a block 88 which utilizes the term $KF \cdot I_D$, the term $I_D$ being the drain current. The factors KF are used to define parameters as noted above with respect to the diode, these being unique to the diode and different than those for other components such as for the JFET, MOSFET or Bipolar devices. This is then passed through the 1/f filter as noted by a block 90 to provide the colored noise component $i^2{}_C$. The white noise component and the colored noise component are then summed together in a summing block 92 to provide the total noise current $i^2{}_T$.

Figure 9:
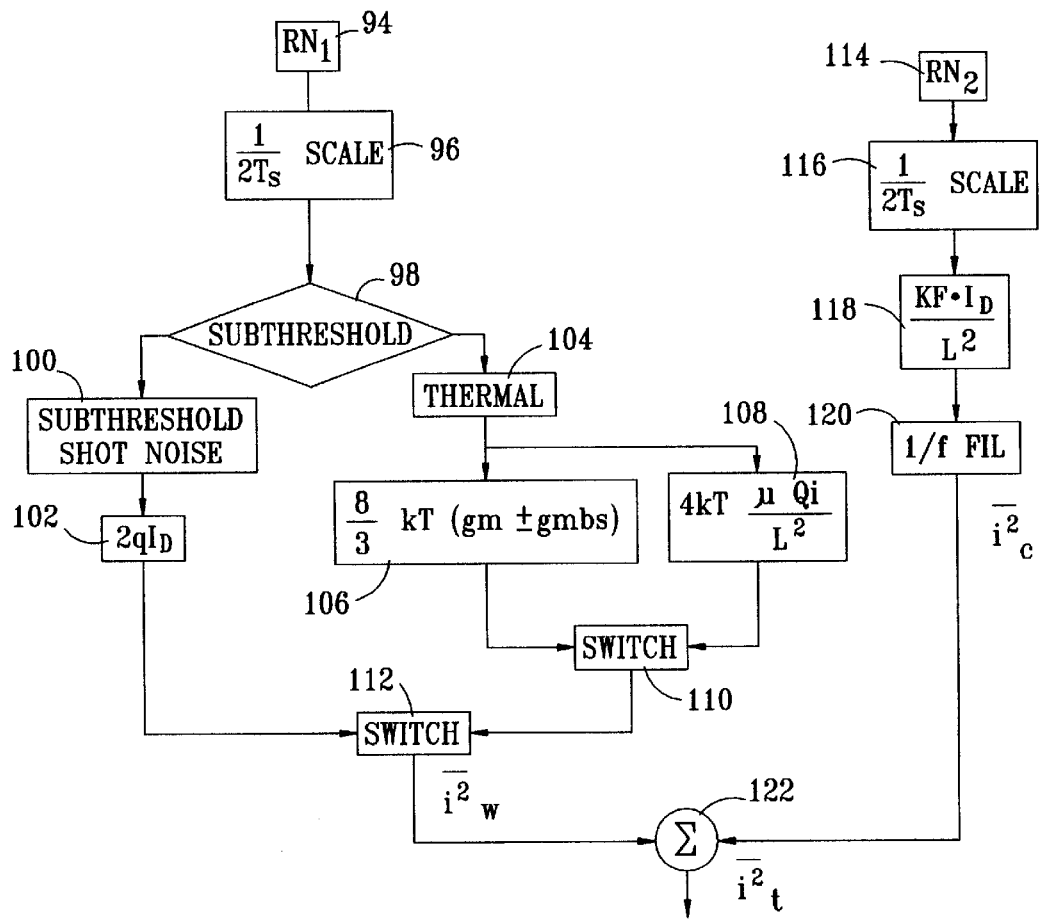
FIG. 9 illustrates a flowchart depicting the operation for determining the total added noise in the time domain for a MOSFET.

Referring now to FIG. 9, there is illustrated a flowchart depicting the noise operation of a MOSFET. In a MOSFET, there are a number of noise sources. Below the threshold, the primary noise source will be shot noise. Above the threshold, the primary noise source will be thermal noise. Therefore, there is a provision made for these two noise sources depending upon the bias noise, as will be described hereinbelow. Further, there will be described two different models for the thermal noise component. As noted with respect to the JFET, there is a white noise component and a colored noise component. For the white noise component, a noise source $R_{N1}$ is provided, as indicated by a block 94. This is then scaled in a block 96 by the $1/(2T_S)$ scaling factor to provide the white noise source for the simulator. The system will then flow to a decision block 98 to determine if the component is operating in a sub-threshold region. If so, then the process will flow to a block 100 to define this as shot noise. This will then provide a model in block 102 of the following relationship:

$$2qI_D$$

where: q=electronic charge constant=$1.602 \times 10^{-19}$ Coulombs,
 $I_D$=drain current.
If the system determines it is above sub-threshold, then the process will flow to block 104 indicating that it is thermal noise. The system will pick one of two models. The first model is defined in a block 106 by the following relationship:

$$\frac{8}{3}kT(g_m + g_{mbs})$$

where: k=Boltzmann constant,
 T=absolute temperature,
 $g_m$=transconductance from the gate,
 $g_{mbs}$=transconductance from the bulk.
The newer model that is alternatively selectable by the system is set forth in a $$4kT\frac{\mu Q_i}{L^2}$$

block 108 with the following relationship:
 where: k=Boltzmann constant,
 T=absolute temperature,
 $\mu$=effective mobility of the charge carriers,
 $Q_i$=inversion layer charge,
 $L^2$=the electrical channel length of the transistor.
The two models are selected with a switch block 110 to determine which of the models in blocks 106 or 108 are utilized. A second switch block 112 is utilized to determine whether the output of the model 102 or the output of the switch block 110 is utilized, depending upon the decision made in the decision block 98. The output of the switch block 112 therefore provides the white noise component, $i^2{}_W$.

As with the JFET and the diode, the MOSFET also has a colored noise component. This requires a separate noise source $R_{N2}$, indicated by block 114. This is scaled by the $1/(2T_S)$ scale factor in a block 116 to provide a white noise source which is then scaled by the physics of the device as indicated by a relationship in a block 118 set forth as follows:

$$KF * I_D/L^2$$

This is then processed with the 1/f filter, as indicated in a block 120 to provide the colored noise component, $i^2{}_C$. Both the white noise component $i^2_W$, and the colored noise component $i^2_C$ are summed in a summing junction 122 in order to provide the total noise component $i^2_T$.

Figure 10:
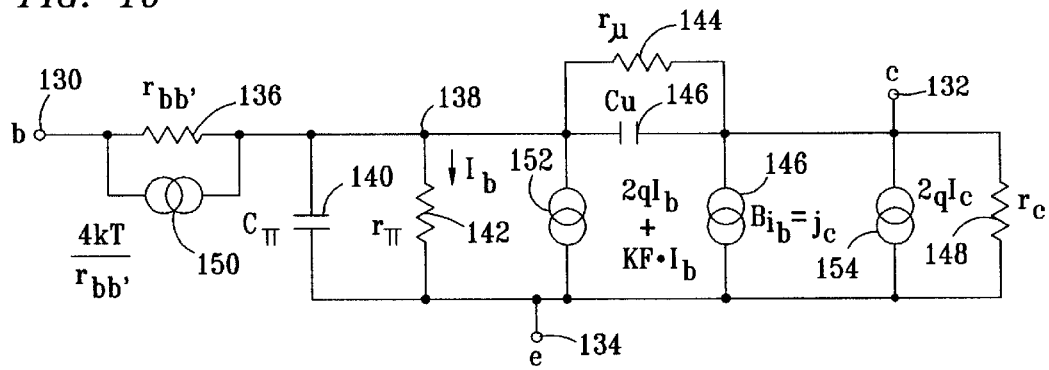
FIG. 10 illustrates an electrical schematic of a bi-polar junction transistor (BJT) with three separate noise sources inserted at various locations in the transistor structure.

Referring now to FIG. 10, there is illustrated a diagrammatic view of a bipolar junction transistor (BJT) illustrating the equivalent circuit for the BJT and the addition of noise sources. The BJT has a base terminal 130, a collector terminal 132 and an emitter terminal 134. The base terminal has a base resistance $r_{bb}'$ 136 disposed in series of the base terminal and a node 138. Node 138 has a capacitor 140 labeled $C_\pi$ disposed between the node 138 and the emitter terminal 134. A base-emitter resistor 142 is disposed between node 138 and emitter terminal 134 and is labeled $r_\pi$. Node 138 is connected to the collector 132 through a base-collector resistor 144, labeled $r_\mu$. In parallel with resistor 144 is a capacitor 146 labeled $C_\mu$. A collector emitter current source 146 is provided which has a gain relationship between the collector current and the base current according to $$\beta i_b = i_c$$

the following relationship:

where: $i_b$ is defined as the current flowing through $r_\pi$. An output collector-emitter resistor 148 is connected between the collector terminal 132 and the emitter terminal 134.

Additional current sources are added that account for the various noise sources that must be modeled. A first noise current source 150 is provided in parallel with the base resistance $r_{bb}'$ 136. This current source has a physical $$\frac{4kT}{r_{bb'}}$$

scaling factor as follows:
A second current source 152 is disposed between the terminal 138 on the base side of the transistor but on the opposite side of the base from resistor 136, and the emitter terminal 134. The current source 152 has the 1/f noise component accounted for therein and is modeled according to the following relationship:

$$2qI_b + KFI_b$$

Figure 11:
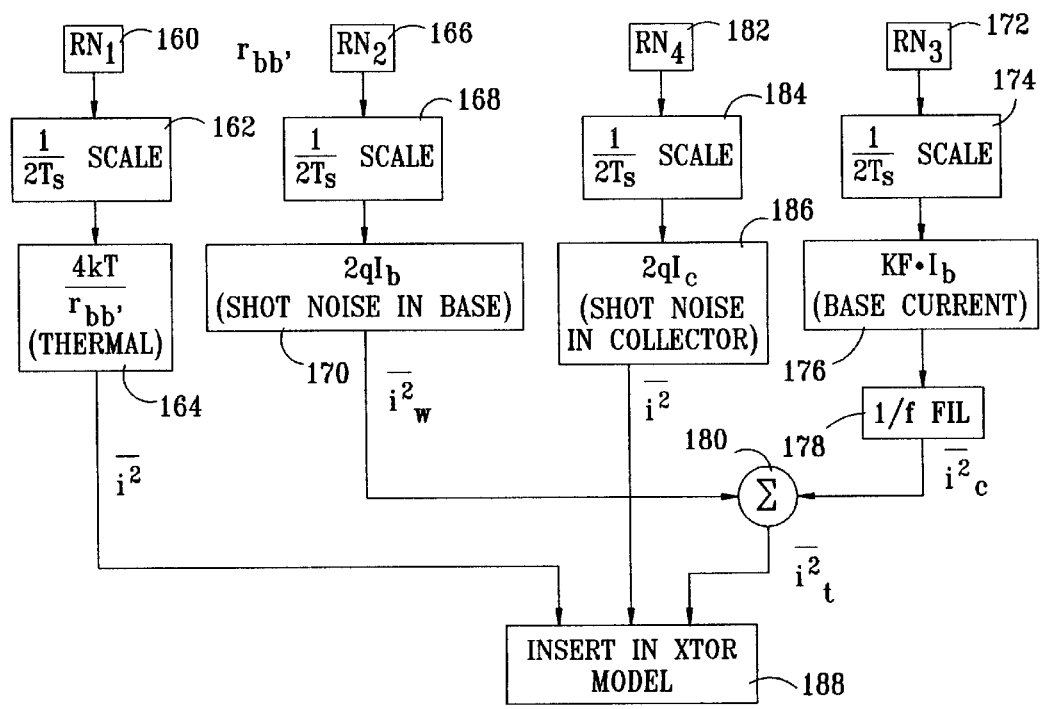
FIG. 11 illustrates a flowchart depicting the operation for determining the total added noise in the time domain for a BJT.

A third current source 154 is provided and disposed between the collector terminal 132 and the emitter terminal 134 and parallel with the current source 156. This current source accounts for the collector current noise source and is modeled $$2qI_c$$

according to the following physical relationship:
Referring now to FIG. 11, there is illustrated a flowchart depicting the actual generation of the noise in the noise sources 150, 152 and 154. Current source 150 has associated therewith a random number generator $R_{N1}$, as represented by a block 160. This is scaled by the $1/(2T_S)$ factor, as indicated by a block 162 and then processed through the relationship in Equation 16. This represents the thermal noise, as indicated in a block 164. The current source 152 is comprised of both a white noise component and a colored noise component. The white noise component has associated therewith a random noise generator $R_{N2}$ as indicated in a block 166 which is scaled with the $1/(2T_S)$ scaling factor, as indicated by a block 168. This provides a white noise source for the simulator that is then scaled by the physics of the device, as indicated by a block 170 in accordance with first part of Equation 17. This constitutes the shot noise in the base. For the 1/f component or the colored portion of the noise, a third random noise generator $R_{N3}$ is required, as indicated by a block 172. This is scaled by the $1/(2T_S)$ scale factor, as indicated in a block 174 and then scaled by the physics of the base current, the second portion of Equation 17, as indicated by a block 176. This is then processed through a 1/f filter 178 to provide the colored noise component $i^2_C$. Both the output of block 170 and the output of block 178 are summed with a summing junction 180 to provide the total noise current $i^2_T$ for the current source 152.

The current source 154 requires a fourth random noise generator $R_{N4}$ as indicated by a block 182. This is scaled by the $1/(2T_S)$ scale factor, as indicated by a block 184 to provide a white noise source for the simulator operation. This is then scaled by the physics of the collector to provide the shot noise in the collector, as indicated by a block. 186 utilizing Equation 18. The output of the noise generators 150, 152 and 154 are then inserted into the transistor model of FIG. 10.

The above noted devices set forth in FIGS. 5a–5e represent electrical components that have internal noise generators associated therewith. It should be understood that any electrical component could be modeled in such a way as long as the physics of the device can be realized. Therefore, it is anticipated that future devices or modifications of the above noted devices in FIGS. 5a–5e could be utilized in the simulator, this merely requiring a model to be generated for the noise source and that model be incorporated into the physics of the device. This model is then multiplied by a white noise source that is scaled by the $1/(2T_S)$ factor, this white noise source being a Gaussian noise source as described hereinabove.

Referring now to FIG. 12, there is illustrated a block diagram of an Infinite Impulse Response (IIR) filter for use with determining the 1/f or colored component of the noise. This filter combines the functions of the 1/f filters described hereinabove and the scaling factor $1/(2T_S)$. In order to simulate 1/f noise, it is desirable to design a filter to spectrally shape the white noise that is generated by the random number generator, this random number generator being that scaled by the $1/(2T_S)$ scaling factor. It is desirable that the filter provide the $$N^2_{1/f}(f) = N^2(f)H^2(f) = 1/f$$

following relationship:
When the white noise source is substituted for this value, the following relationship $$2T_s \frac{\sin^2(\pi T_s f) H^2(f)}{(\pi T_s f)^2} = \frac{1}{f}$$

will result:
When the frequency is much less than the $1/(2T_S)$ scaling factor, this will result in $$2T_S H^2(f) = 1/f$$

the 1/f component being:
This will result in the following:

$$H^2(f) = 1/(2T_S f)$$

When approximating this filter function H(f) with a Finite Impulse Response (FIR filter), some difficulties can be incurred due to the large number of taps required in such a filter. However, it has been noted that H(f) can be approximated to an acceptable degree with an Infinite Impulse Response filter (IIR) consisting of several first order filters in parallel, with the pole frequencies logarithmically spaced. Utilizing this approach, a seventh order IIR filter can be realized which approximates H(f) down to $1/(10^7 Ts)$ in accordance with the equation:

$$H(z) = \sum_{i=0}^{6} B_i / (1 - A_i z^l)$$

The weights for this filter are $A_i$ and $B_i$ which are set forth in one example in the following Table:

TABLE 1

| I | $A_i$ | $B_i$ |
|---|---|---|
| 0 | 0.999999371681 | 0.0014491579 |
| 1 | 0.999993716837 | 0.0032542235 |
| 2 | 0.999937170117 | 0.010390639 |
| 3 | 0.999371878774 | 0.032615981 |
| 4 | 0.993736471541 | 0.10124480 |
| 5 | 0.939062505821 | 0.34645883 |
| 6 | 0.509525449495 | 0.93488996 |

Referring further to FIG. 12, the above noted filter is illustrated. Again, a separate random noise generator $R_N$ is required for the 1/f computation, a indicated by a block 192 which is scaled by the device physics scaling factor (the KF·I scaling factors for a particular device) as indicated by a block 194. This provides a white noise source for the operation scaled by the physics of the device. This is then processed through one of multiple IIR filters 196 labeled $H_1(f)$, $H_2(f)$, $H_3(f)$, .... The output of each of these filters 196 is summed with a summer 198 to provide the output H(z). Again, it is only necessary to change the weights of each of the filters 196 to change the pole frequencies. As described above, these pole frequencies are logarithmically spaced. It is again noted that the $1/(2T_S)$ scaling factor is accounted for in the filter function H(f).

In summary, there has been provided a technique by which the noise response of a circuit can be simulated in the time domain. This is facilitated by including the physical fluctuation (noise) in the transient simulation in the circuit simulator. A separate noise source is generated for each component in the matrix to be solved. This noise source is added in parallel with the device current generator. The current added is generated with a stochastic (random) process current generator, $(i^2)^{1/2}$. This stochastic current generator utilizes a Gaussian random number generator with zero mean and a variance equal to one that is scaled by the standard deviation (square root of the variance) of the physical noise process that exists within the device. For active devices such as MOSFETs, the physical noise sources may also include 1/f noise, as well as thermal and shot noise. Further, each of the random noise sources is also scaled for the stepped operation of the simulator operation which is a sampled time step operation.

Although the preferred embodiment has been described in detail, should be understood that various changes, substitutions and alterations can be made therein without departing from the spirit and scope of the invention as defined by the appended claims.

What is claimed is:

1. A simulator for simulating the noise response of an electrical circuit in the time domain, which simulator operates in discrete time steps $T_S$, comprising:

a matrix of electrical circuit elements representing the electrical circuit;

an analyzer for analyzing the transient response of the circuit elements in the matrix in the time domain with a known input signal to provide a deterministic current value for each of said elements operating in the electrical circuit;

a stochastic noise source associated with each of said elements, each for generating a noise current for the associated element that represents a stochastic random process comprised of a white noise source scaled by the standard deviation of the physical noise process that exists within said associated element;

a primary summing device is associated with each of said elements for summing the generated noise current for the associated one of said stochastic noise sources with the deterministic current values associated with each of said elements; and a matrix solver for solving the matrix after said summing device has performed the associated summing operation.

2. The simulator of claim 1 wherein each of said stochastic noise sources comprises:

a Gaussian random number generator for generating a random number;

a first scaling device for scaling the output of said Gaussian random number generator by a first scaling factor, said scaling device accounting for the discrete operation of the simulator and the time step therein; and a second scaling device for scaling said scaled output of said Gaussian random number generator by a second scaling factor to account for the physical device process of said associated element.

3. The simulator of claim 2, wherein said Gaussian random number generator has a mean of zero and a variance of one.

4. The simulator of claim 2, wherein said first scaling factor comprises $1/(2T_S)$.

5. The simulator of claim 2, wherein:

said stochastic noise source is comprised of at least first and second stochastic noise sources, said first stochastic noise source associated with a white noise component, representing the white noise of said associated element, and said second stochastic noise source associated with a colored noise component representing the 1/f noise of said associated element; and a second summing device for summing the output of said first and second stochastic noise sources to provide a total noise component for said associated element, said primary summing device operable to sum the square root of the total noise current with the deterministic current value of the said associated elements.

6. The simulator of claim 5, wherein each of said first and second stochastic noise sources include:

a Gaussian random number generator for generating a random number;

a third scaling device for scaling the output of said Gaussian random number generator by a third scaling factor, said scaling device accounting for the discrete operation of the simulator and the time step therein; and a fourth scaling device for scaling said scaled output of said Gaussian random number generator by a fourth scaling factor to account for the physical device process of said associated element.

7. The simulator of claim 6, wherein said second stochastic noise source includes a 1/f filter.

8. The simulator of claim 5, wherein said second stochastic noise source comprises:
- a Gaussian random number generator for generating a random number;
- a fifth scaling device for scaling the output of said Gaussian random number generator by a fifth scaling factor that it represents the physical device process of said associated elements; and
- a 1/f filter for providing the 1/f component of the 1/f noise; and
- a sixth scaling device for scaling the noise by a sixth scaling factor accounting for the discrete operation of the simulator and the time step therein.

9. The simulator of claim 8, wherein the sixth scaling factor comprises $1/(2T_s)$.

10. The simulator of claim 9, wherein said 1/f filter and said sixth scaling device are realized with an Infinite Impulse Response filter.

11. The simulator of claim 10, wherein said Infinite Impulse Response filter comprises a plurality of first order Infinite Impulse Response filters disposed in parallel, with the pole frequencies of each of said parallel configured Infinite Impulse Response filters having pole frequencies being logarithmically spaced.

12. The simulator of claim 11, wherein each of said Infinite Impulse Response filters operates in accordance with the following relationship:

$$H(z) = \sum_{i=0}^{N} B_i / (1 - A_i z_I)$$

wherein $A_i$ and $B_i$ are the filter weights and the value of N+1 comprises the number of filters.

13. A method for designing and manufacturing integrated circuits, comprising the steps of:
- providing a simulator for simulating the transient response of electrical circuit elements, said simulator operating in discrete time steps;
- disposing a plurality of electrical circuit components in a matrix in said simulator, which matrix of electrical circuit components represents an electrical circuit;
- analyzing with an analyzer within said simulator the transient response of the circuit elements in the matrix in the time domain with a known input signal to provide a deterministic current value for each of the elements operating in the electrical circuit;
- associating a stochastic noise source with each of the elements, and generating a noise current within said simulator with the associated stochastic noise source for the associated element
- summing the generated noise current for the associated one of said stochastic noise sources with the deterministic current values associated with each of said elements;
- solving the matrix after said summing step has performed the associated summing operation to provide a final simulation result for each of said circuit elements;
- evaluating said electrical circuit for manufacture from the results of said solving; and
- manufacturing integrated circuits realizing said electrical circuit.

* * * * *